United States Patent
Reynolds, Jr.

(10) Patent No.: US 7,032,149 B2
(45) Date of Patent: Apr. 18, 2006

(54) APPARATUS AND METHOD FOR ADAPTING A LEVEL SENSITIVE DEVICE TO PRODUCE EDGE-TRIGGERED BEHAVIOR

(75) Inventor: John C. Reynolds, Jr., Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 357 days.

(21) Appl. No.: 10/449,332

(22) Filed: May 30, 2003

(65) Prior Publication Data

US 2004/0243898 A1   Dec. 2, 2004

(51) Int. Cl.
*G01R 31/28* (2006.01)

(52) U.S. Cl. ............................ 714/733; 714/718

(58) Field of Classification Search .............. 327/202; 326/93, 16; 716/18; 714/727, 718, 733
See application file for complete search history.

(56) References Cited

U.S. PATENT DOCUMENTS

| | | | | |
|---|---|---|---|---|
| 5,463,338 A | * | 10/1995 | Yurash | 327/202 |
| 5,504,441 A | * | 4/1996 | Sigal | 326/93 |
| 5,831,868 A | * | 11/1998 | Beausang et al. | 716/18 |
| 6,529,033 B1 | * | 3/2003 | Park et al. | 326/16 |
| 6,564,347 B1 | * | 5/2003 | Mates | 714/727 |

* cited by examiner

*Primary Examiner*—David Ton
(74) *Attorney, Agent, or Firm*—Blakely, Sokoloff, Taylor & Zafman LLP (57) ABSTRACT

A circuit for adapting a level sensitive memory device to exhibit edge-triggered behavior. The adapter circuit can be used with testing modules that expect edge-triggered behavior. The adapting circuit may include address decoding circuitry and output storage and delay circuitry.

20 Claims, 6 Drawing Sheets

APPARATUS AND METHOD FOR ADAPTING A LEVEL SENSITIVE DEVICE TO PRODUCE EDGE-TRIGGERED BEHAVIOR

BACKGROUND

1. Field of the Invention

Embodiments of the invention relate to adapting level sensitive devices for use in edge triggered systems. In particular, embodiments of the invention relate to adapting level sensitive random access memory devices for use with built in self test systems designed for use with edge triggered devices.

2. Background

Many computers systems are being designed to improve the level of system reliability by including built in self test (BIST) software and hardware modules that check the operating condition of the components that comprise the computer system. The BIST alerts the system to faulty hardware components or sub components and allows the computer system to avoid using these components or notify a user of their condition if they fail during testing in order to avoid catastrophic failures and increase up-time and reliability of the system.

Many BIST modules were designed to test edge triggered devices. An edge triggered device produces reliable outputs at a predefined period after the leading edge of a clock signal. An edge triggered register file or memory module if presented with a read request on a first clock edge will usually produce the requested data by the leading edge of the next clock cycle. Level sensitive devices include latches, and certain types of memory caches and random access memory (RAM) modules such as static RAMs (SRAMs). Level sensitive devices are driven by voltage levels of incoming signals including clock signals. For example, a level sensitive SRAM which receives a typical square wave clock signal when starting a read operation may have a 'high' output for the period when the clock signal is high. Data is output during the 'low' phase of the clock signal and when the clock signal again transitions to a 'high' level, the data output also begins to transition.

BIST modules typically are designed to test edge triggered devices. Edge triggered devices allow output changes to occur based only on input at a single clocked instant which is an edge of a clock signal. The output is stable at a predefined period after that same clock edge. Many BIST modules expect edge triggered device behavior such as stable and deterministic output at a clock edge. Thus, BIST modules cannot accurately test level-sensitive devices. BIST modules test memory devices by sending a read request to a device to be tested after having stored a known value at a given address location in the device. The read request retrieves the stored value and sends it back to the BIST module for verification. The read request occurs on a first leading clock edge. Output is expected on the next leading clock edge. However, the output for a level sensitive device (with "transparent" pre-charge) will begin to transition to a high output when it receives the next leading clock edge causing a non-deterministic value to be read by the BIST module on the second leading clock edge.

BRIEF DESCRIPTION OF THE DRAWINGS

Embodiments of the invention are illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

DETAILED DESCRIPTION

Figure 1A:
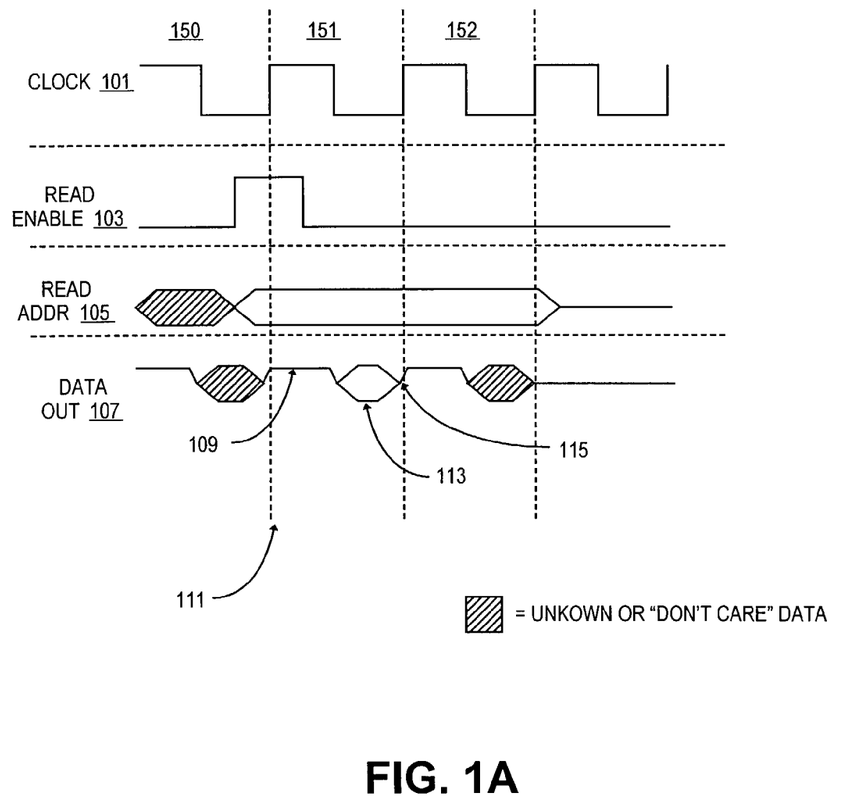
FIG. 1A is a timing diagram of a read request for level sensitive random access memory module.

FIG. 1A is a timing diagram showing the behavior of a level sensitive random access memory (RAM) device when a read operation is requested. An incoming clock signal 101 governs the behavior of the RAM. In one embodiment, this clock signal is a read clock signal specific to driving read operations. A read enable signal 103 enables the RAM to perform a read operation. An address signal or set of address signals 105 indicate the location in memory for a read operation for the RAM device. In one embodiment, the address signals are binary encoded signals or similar encoded signals. In another embodiment, the address signals are not encoded. The data out signal 107 is the output of the RAM for any operation of the RAM.

The diagram illustrates a series of clock cycles labeled 150–152 over which a read operation occurs. The read cycle begins at the leading edge of clock cycle 151 indicated by line 111. Prior to clock cycle 151, the read enable signal 103 is high and remains high to enable a read operation to occur that will retrieve data based on the address presented by the address signal 105 at the time of the leading edge of clock signal 151. In one embodiment, the read address is maintained for the duration of the read operation. Immediately subsequent to the start of the read operation 111 the data output is driven high 109 for the length of time that the clock signal 101 remains high. Valid data 113 from the read operation is output during the 'low phase' of the clock signal 101.

At the leading edge 115 of clock cycle 152 the data output 107 transitions to a high level driven by the rising clock signal starting the next cycle 152. This creates a race condition between the transition of the data output signal 107 to a high value and the capture of the output by a device reading or utilizing the output data at the leading edge of clock cycle 152. Devices utilizing data at the leading edge are expecting edge triggered behavior such as built in self test modules (BIST). This produces non-deterministic output for the level sensitive RAM if used in conjunction with BIST module resulting in an unreliable assessment of the RAM's integrity by the BIST module.

Figure 1B:
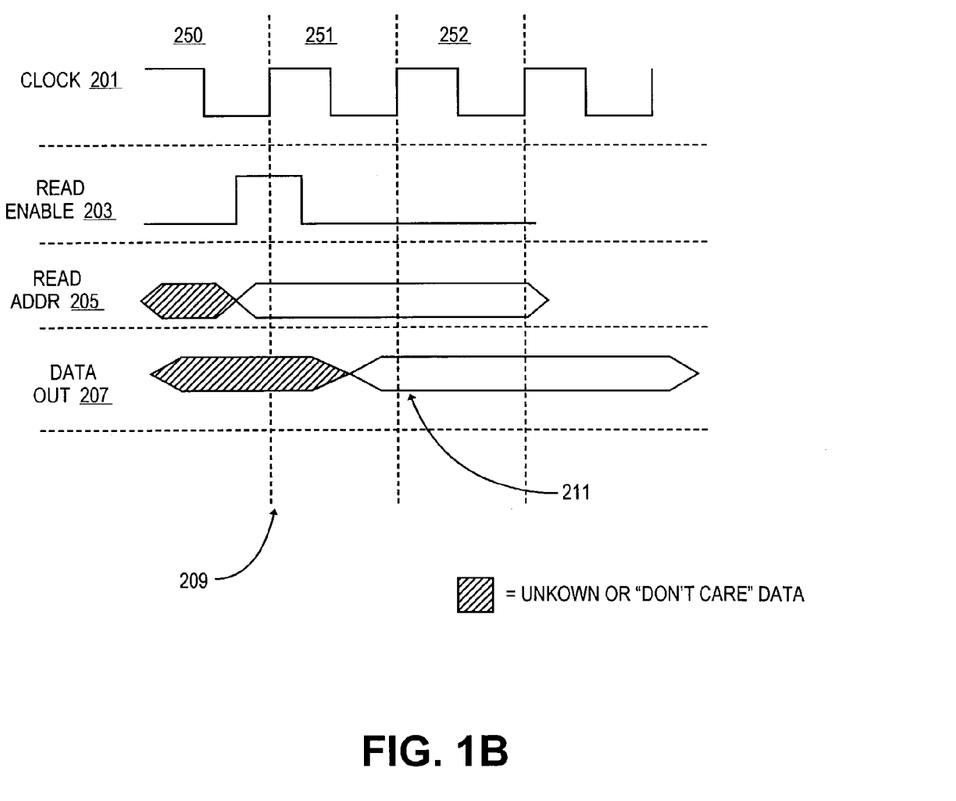
FIG. 1B is a timing diagram of a read request for a edge triggered random access device.

FIG. 1B is a timing diagram of the operation of an edge-triggered RAM device performing a read operation over a set of clock cycles 250–252. This diagram represents the expected behavior of an edge-triggered memory device, which is relied upon by other components and modules such as BIST module. A clock signal 201 governs the timing of the read operation. A read operation is enabled by a read enable signal 203 which is 'high' at the leading edge 209 of a first clock cycle 251. This initiates the read operation of the RAM, which begins the process of retrieving data for output in the form of the data output signal 207. The data to be retrieved is data stored at the address encoded in the read address signal 205 presented at the leading edge 209 of clock cycle 251. When the leading edge 211 of the clock cycle 252 arrives the requested data output is presented as data out signal 207.

The output 207 of an edge triggered device is deterministic at a given clock edge. Thus, the edge triggered device can be tested by a BIST module by retrieving known data stored at each address in the memory device in order to verify the function of the device.

Figure 1C:
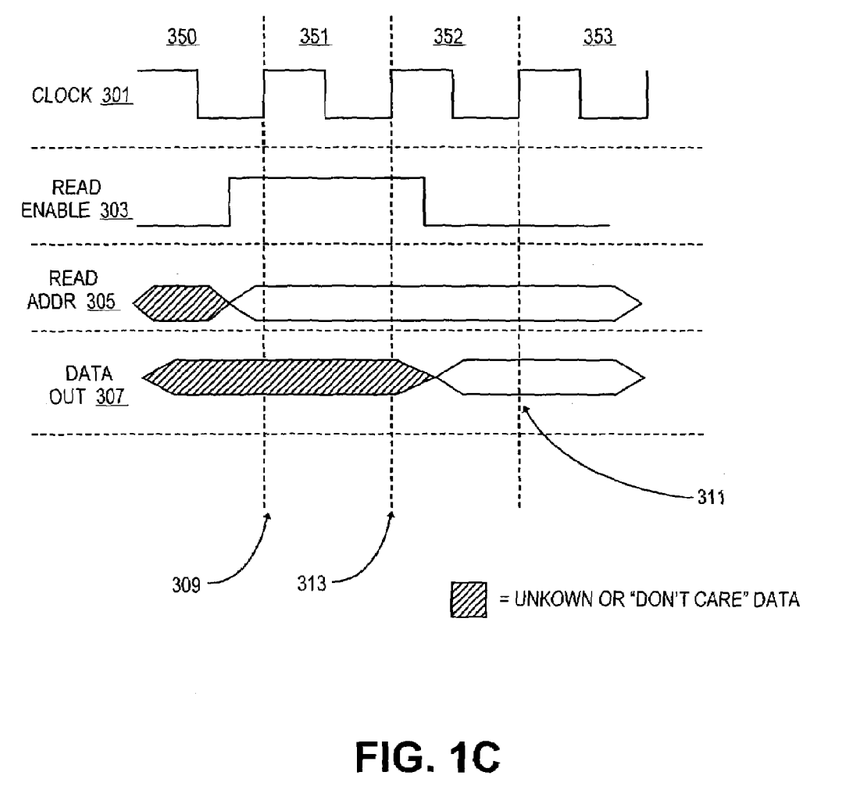
FIG. 1C is a timing diagram of a read request for an adapted level sensitive random access device.

FIG. 1C is the timing diagram of a read operation over a set of clock cycles 350–353 for an exemplary implementation of an adapted level sensitive RAM device. A read enable signal 303 is asserted prior to the leading edge 309 of a clock cycle 351. The read enable signal remains high during the first rising clock edge 309 of cycle 351. This initiates the read operation of the adapted RAM. The read enable signal 303 is maintained in a logical high state for the duration of clock cycle 351 and during the leading edge 313 of clock cycle 352.

The incoming address signal 305 for the location in memory to be retrieved is maintained for two clock cycles (351, 352). Data output 307 that is deterministic is presented at the leading edge 311 of a clock cycle 353. In one embodiment, BIST module may be configured to test any edge triggered state behavior involving read and writes to a memory structure. The BIST module can be configured to test a circuit having a read operation that requires a read enable signal, address signal or similar signal to remain asserted for any number of clock cycles.

Thus, a read operation for testing the adapted level sensitive RAM may require two complete clock cycles to complete. However, the data output 311 is stable and deterministic and can be used by a BIST module to verify the operation of the RAM device. The read cycle is carried out over two or more clock cycles, dependent on the support of the BIST module testing the RAM. In one embodiment, the timing of read operation signals is adjusted to adjust the duration of the typical read operation signals by configuring the BIST module to generate read operation signals that match the timing of the adapted level sensitive RAM (e.g., maintaining read operation signals for two clock cycles). In another embodiment, the BIST module may be configured to generate signals of greater duration (e.g., more that two clock cycles) if required by an adapted level sensitive RAM.

Figure 2:
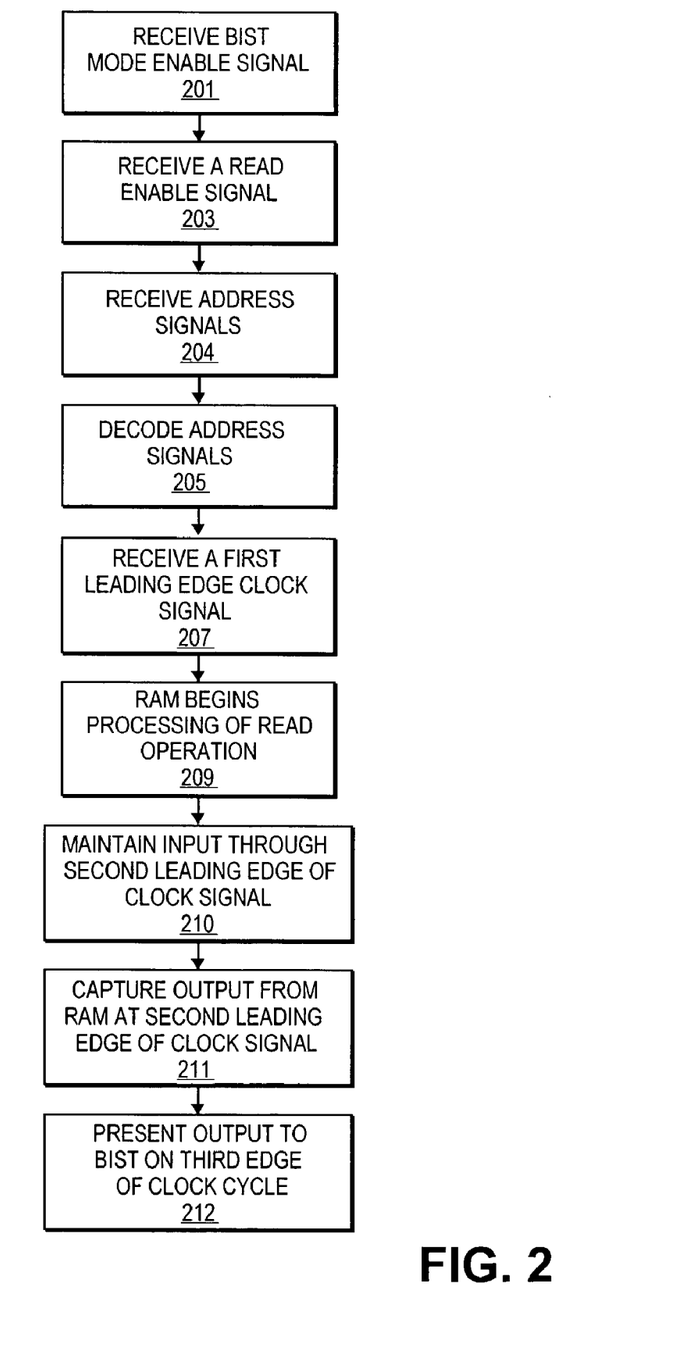
FIG. 2 is a flowchart for the adaptation of a level sensitive random access device for use with a BIST configured for edge triggered devices.

FIG. 2 is a flowchart for the process of adapting a level sensitive RAM device for use with a BIST configured for edge triggered devices. The BIST module tests RAM devices using reads of a known value from a location in the RAM memory device that the BIST module had previously stored at the location in order to verify the memory's operation. A BIST module generates a BIST mode enable signal that is received by the adapted level sensitive device (block 201). In one embodiment, the BIST module continues to assert the mode enable signal during the entire testing, including the read and write operation performed on the memory.

A read enable signal is subsequently received by the adapted level sensitive device (block 203). In one embodiment, the BIST module generates the read enable signal. An address signal is then sent from the BIST module to the adapted level sensitive device (block 204). The address signal indicates the location in memory to be tested. In one embodiment, the adapted level sensitive device fully decodes the incoming address for the RAM (block 205). A leading edge of a clock cycle is received by the adapted level sensitive device (block 207). The clock signal is generated by a system clock, oscillator or similar device. Receipt of the leading edge of the clock signal while the read enable signal is asserted triggers the start of a read operation for the RAM (block 209). The read operation will retrieve the data stored at the address presented to the RAM at the time the leading edge of the clock signal is received while the read enable signal is logically high.

The inputs into the adapted level sensitive device are maintained at a constant value through a second leading edge of the clock signal (block 210). The inputs maintained include the read address and read enable signals. When the read operation completes, the stored data is output from the RAM. The retrieved data is presented to the adapted level sensitive device's internal storage circuit before the second clock edge occurs (block 211). The data can be accessed or presented to the BIST module on the third clock cycle (block 213).

This process could be used with any other component that required edge triggered behavior from a level sensitive device. A BIST module is an exemplary component for use with the memory device.

Figure 3:
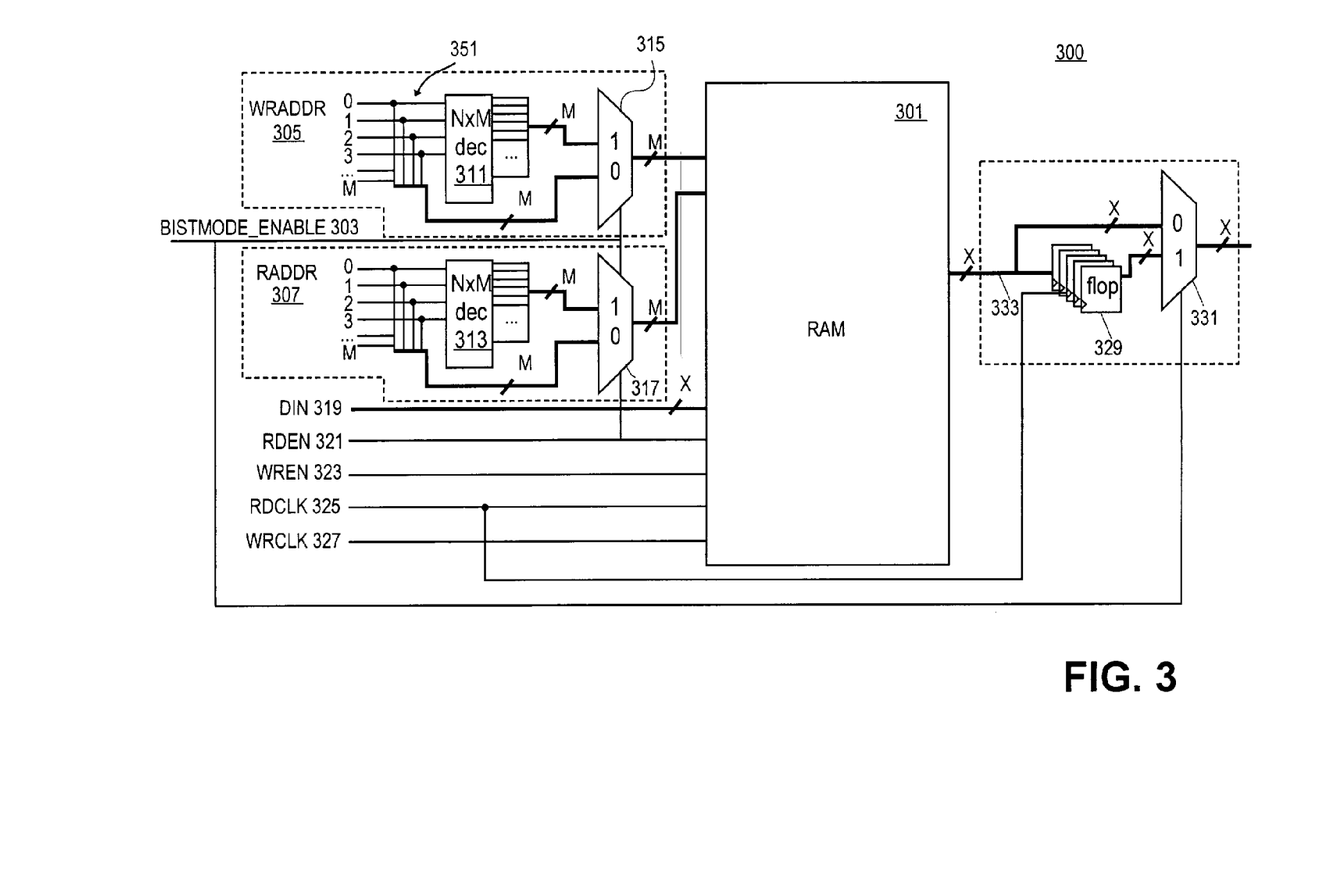
FIG. 3 is a diagram of an adaptation circuit.

FIG. 3 is an illustration of a circuit 300 for adapting a level sensitive RAM for use with devices or modules requiring edge triggered behavior. The circuit includes a RAM 301. In one embodiment, RAM 301 is an SRAM. The SRAM may utilize fully encoded read and write addresses and have sizes that include (words×bitwidth): 65×128, 65×192, 66×16 or similar sizes. In another embodiment, the SRAM may utilize "one-hot" encoding (a single signal indicates an address) for read and write address and have sizes that include (words×bitwidth): 8×64, 16×33 or similar sizes. Both "one-hot" and encoded SRAMs may have a "transparent pre-charge" on the output ports when the clock input is high, i.e., the clock input signal initially drives the output while logically high.

In one embodiment, RAM 301 is connected to a write address decode circuit 305. In another embodiment, circuit 300 does not include write address decode circuit 305, because RAM 301 is compatible with the addressing format used by the BIST module.

Write address decoding circuit 305 receives address lines 351. Address lines 351 are connected through a bus or similar apparatus to the BIST module. Address lines 351 are connected to decoder 311 and a multiplexor, or similar selection device 315. Address lines 351 may be of varying width dependent on the RAM 301 and system architecture. In one embodiment, the width of address lines (i.e., the number of individual lines for transmitting the address in parallel) is of sufficient size to individually address each location in RAM 301.

Decoder 311 translates the incoming address encoded on address lines 351 into a format native to RAM 301. In one embodiment, decoder 311 fully decodes an incoming address that is encoded in a format not supported by RAM 301. For example, a binary encoded address may be decoded into a 'one-hot' signal. The decoded signals are output by decoder 311 into a selection device 315.

In one embodiment, selection device 315 is controlled by BIST mode enable signal 303. BIST mode enable signal 303 is generated by the BIST module or related devices to indicate when the BIST module is in operation. When the BIST module is in operation selector 315 outputs (i.e., selects) the data from decoder 311. Thus, RAM 301 receives decoded addresses in a native format when BIST mode is enabled in a manner that is transparent to RAM 301 allowing it to function as normal. When the BIST module is not in operation, selector 315 outputs the data from the address lines 351 to RAM 301. RAM 301 in this case receives the address data that it would have received if it were not a part of an adapted circuit for use with a BIST module.

In one embodiment, the write address decoder allows a BIST module to write known data into RAM 301 for testing purposes. The BIST module writes data into RAM 301 then reads it out again and checks that the data is the same as that saved. If a discrepancy occurs then the BIST module has detected an error in the operation of RAM 301 and the appropriate flags or error signals can be output on to the testing system.

In one embodiment, adapted circuit 300 includes a read address decoding circuit 307. Read address decoding circuit 307 operates in a similar fashion to write address circuit 305. Read address circuit 313 includes a decoder circuit 313 and selector 317. Read address circuit 313 receives address lines 351 and BIST mode enable signal 303. When circuit 313 receives a BIST mode enable signal 303, the decoded address data will be output to RAM 301. BIST mode enable signal 303 is asserted during the entire duration of a read operation initiated by the BIST module. When circuit 313 does not receive an asserted BIST enable signal, i.e., the signal is logically 'low,' then read address circuit 313 outputs the address presented on address lines 351 through selector 317 to RAM 301. Thus, RAM 301 receives a decoded address in a transparent manner during BIST initiated read operations and RAM 301 receives its normal input when BIST is not accessing RAM 301.

In one embodiment, RAM 301 also receives data input lines 319, a read enable signal 321, write enable signal 323, read clock signal 325 and write clock signal 327. In another embodiment, any combination of read enable signal 321, write enable signal 323, read clock 325 and write clock 327 may be omitted dependent on the RAM 301 used. In another embodiment, a single clock signal may be used for driving both read and write operations. In one embodiment, a single enable signal input may be used instead of separate read and write enable signals.

Data input lines 319 may receive data to be written to RAM 301 during a write operation. Read enable signal 321 when asserted allows the RAM 301 to process a read operation. Similarly, write enable signal 323 when asserted allows RAM 301 to process a write operation. Read clock signal 325 drives the processing or initiation of a read operation. Write clock signal 327 drives the processing or initiation of a write operation.

In one embodiment, adapted circuit 300 includes an output control circuit 309. Output control circuit 309 includes a storage circuit 329 and selector circuit 331. Data output line 333 from RAM 301 sends data to storage circuit 329 and selector circuit 331. In one embodiment, data output lines have sufficient width to present all data from an addressable location in RAM 301 in parallel. Selector circuit 331 is driven by the BIST mode enable signal 303. When the BIST mode is enabled then selector 331 outputs data from storage circuit 329. When the BIST mode is not enabled then selector 331 outputs data from the data output line 333. Data output signal 333 is unaffected by the adapted circuit 300 when BIST mode is not enabled.

Data storage circuit 329 may be a set of flip-flops or similar devices to store the output of RAM 301. In one embodiment, data storage circuit 329 is driven by the read clock signal 325. In another embodiment, data storage circuit 329 is clocked by a system clock, global clock or similar clock signal. In one embodiment, storage circuit 329 is a set of delay flip flops. In another embodiment, reset-set flip flops, registers, or similar devices are used to store data output from RAM 301. Storage circuit 329 captures output from RAM 301 on a read clock cycle subsequent to the initiating read clock signal. Storage circuit 329 acts to hold the output value of RAM 301 for presentation to other devices without fluctuating over the duration of the read clock cycle, thereby providing a stable and deterministic output signal for devices expecting edge-triggered behavior.

Circuit 300 could be used in conjunction with any device requiring edge-triggered behavior from a level sensitive memory device. A BIST module is an example of a device that can utilize circuit 300. In another embodiment, circuit 300 may be adapted for use with instruction caches, data caches, ROMs, EPRROMS or similar storage devices that may have level sensitive behavior.

Figure 4:
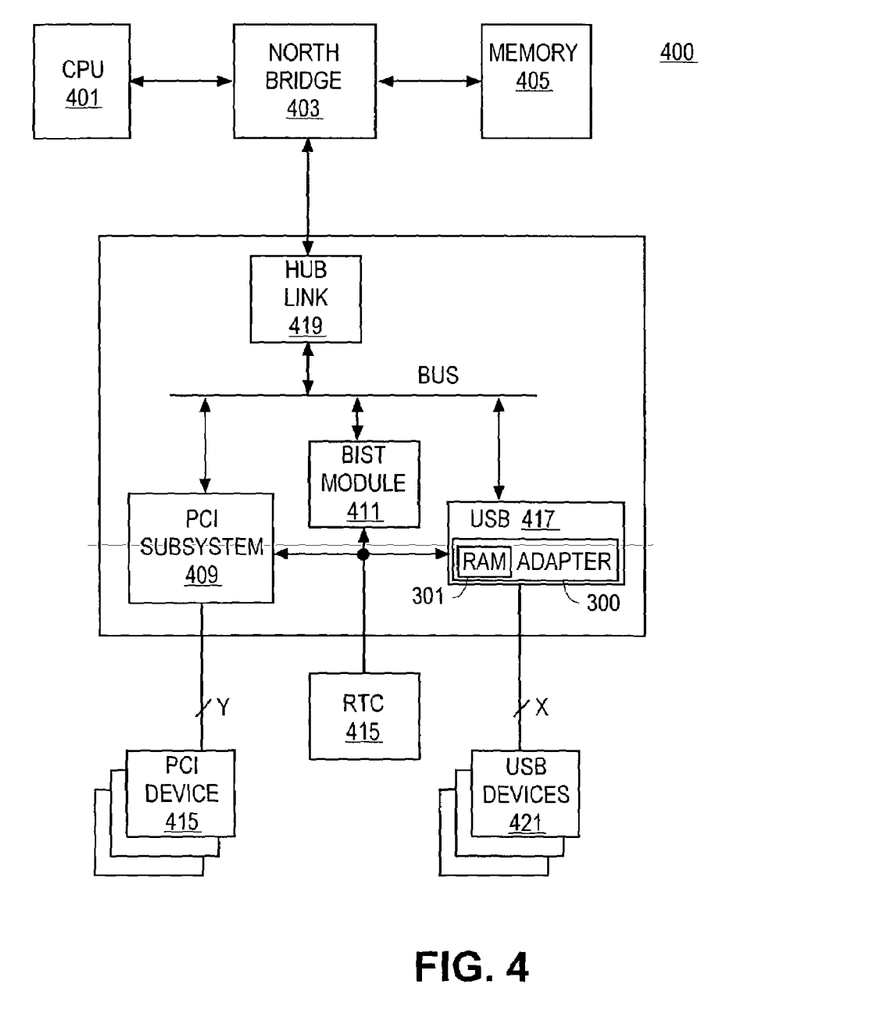
FIG. 4 is a diagram of a computer system with an adaptation circuit.

FIG. 4 illustrates an exemplary system 400 including a circuit for adapting a level sensitive device for use with devices requiring edge triggered behavior. System 400 includes a central processing unit (CPU) 401. In one embodiment, CPU 401 is coupled to a north bridge 403. North bridge 403 enables communication between CPU 401 and memory 405, south bridge 407 and similar devices. In one embodiment, a graphics processor is coupled to north bridge 403. Memory 405 may be a set of memory devices such as dual in line memory modules (DIMMs), single in line memory modules (SIMMs) or similar memory devices.

In one embodiment, system 400 includes a south bridge 407. South bridge 407 controls communication between north bridge 403 and peripheral input devices. South bridge 407 may communicate with north bridge 403 via a communications hub link subsystem 419. Hub link communications controller 419 sends and receives data from bridge 403 and passes incoming data over internal communications bus 437 to peripheral bus controllers. South bridge 407 may be connected to a peripheral component interconnect (PCI) bus. A PCI bus subsystem 409 communicates with PCI devices 415 over the PCI bus. South bridge 407 may also be connected to a universal serial bus (USB), or similar bus system. A USB subsystem 417 communicates over the USB connection with USB devices 421. Other possible subsystems in south bridge 407 include without limitation serial ATA subsystems, PCI-X subsystems, and similar subsystems.

South bridge 407 may be connected to a real time clock circuit or oscillator circuit 415. A built in self test (BIST) module 411 may also be included in south bridge 407. In another embodiment, system 400 includes a single communication hub in place of north bridge 403 and south bridge 407, or utilizes a similar internal communications architecture.

In one exemplary embodiment, USB subsystem 417 may include an adapted level sensitive circuit 300 for a RAM 301. BIST module is coupled to adapter circuit 300 and RAM 301 in order to test the device. BIST module 411 may be directly coupled or indirectly communicate with the adapter circuit through the component or subsystem in which circuit 300 resides. Adapter circuit is also coupled with a system clock 415 or similar clocking mechanism to drive the read clock, write clock or system clock inputs to RAM 301. Circuit 300 and RAM 301 may be directly coupled to system clock 415 or similar structure or may be indirectly coupled through the component or subsystem in which the circuit 300 is embedded. Circuit 300 may receive clocking signals from the component circuitry where it is embedded or from BIST module 411.

Adapted circuits 300 can be added to or placed in a component or a system that utilizes level sensitive devices.

In another embodiment, an adapter circuit 300 and RAM 301 are a part of a PCI subsystem 409, hub link subsystem 419, north bridge 403 peripheral device or similar system 400 component. Circuit 300 allows the continued use of level sensitive devices without requiring significant redesign of a system 406. Previously incompatible BIST modules 411 and RAMS 301 already tested and commonly in use can be used together in new designs with minor or no modification using circuit 300 which operates transparently to both components. Likewise any other component requiring edge triggered behavior of devices similar to RAM 300 could be used with circuit 300. This allows for reduced costs in development and manufacturing of systems and components using circuit 300 because well known components, including off-the-shelf components can be used together without requiring extensive redesign and testing.

In the foregoing specification, the invention has been described with reference to specific embodiments thereof. It will, however, be evident that various modifications and changes can be made thereto without departing from the broader spirit and scope of embodiments of the invention as set forth in the appended claims. The specification and drawings are, accordingly, to be regarded in an illustrative rather than a restrictive sense.

What is claimed is:

1. A device comprising:
   a first circuit to detect a self test mode; and
   a second circuit coupled to the first circuit to convert a level sensitive device output to an edge triggered output form.

2. The device of claim 1, wherein the first circuit includes a selection device to select one of a level sensitive output form and the edge triggered output form.

3. The device of claim 1, wherein the second circuit includes one of a storage device and a delay device.

4. The device of claim 1, further comprising:
   a third circuit coupled to the first circuit to convert an encoded address to a fully decoded address.

5. The device of claim 1, further comprising:
   a level sensitive storage device coupled to the second circuit.

6. The device of claim 5, wherein the storage device is a static random access memory.

7. An system comprising:
   a bus;
   a processor coupled to the bus;
   a input output controller coupled to the bus;
   a random access memory device coupled to the input output controller;
   a first circuit coupled to the random access memory device to select between a level sensitive output form and an edge triggered output form; and
   a second circuit coupled to the first circuit to covert a level sensitive output form to an edge triggered output form.

8. The system of claim 7, further comprising:
   a third circuit coupled to the random access memory device to convert an encoded address to a fully decoded address.

9. The system of claim 7, wherein the second circuit includes one of a storage device and a delay device.

10. The system of claim 7, further comprising:
    a built in self test module coupled to the first circuit.

11. A method comprising:
    receiving a mode selection signal;
    converting a level sensitive device output to an edge triggered output format; and
    selecting one of a level sensitive output form and an edge triggered output form.

12. The method of claim 11, wherein the selecting one of a level sensitive output form and edge triggered output form is based on the mode selection signal.

13. The method of claim 11, further comprising:
    converting an encoded address to a fully decoded address.

14. The method of claim 11, further comprising:
    delaying an output from a level sensitive device.

15. A device comprising:
    a means for converting a level sensitive device output to an edge triggered output format; and
    a means for selecting one of a level sensitive output format and an edge triggered output format.

16. The device of claim 15, further comprising:
    a means for selecting an output form based on a mode selection signal.

17. The device of claim 15, further comprising:
    a means for converting an encoded address to a fully decoded address.

18. A machine-readable medium that provides instructions, which when executed by a machine cause the machine to perform operations comprising:
    receiving a mode selection signal;
    converting a level sensitive device output to an edge triggered output format; and
    selecting one of a level sensitive output form and an edge triggered output form.

19. The machine readable medium of claim 18, further including instructions which when executed by the machine cause the machine to perform operations comprising:
    converting an encoded address to a fully decoded address.

20. The machine readable medium of claim 18, further including instructions which when executed by the machine cause the machine to perform operations comprising:
    delaying an output from a level sensitive device.

* * * * *